US012538513B2

(12) United States Patent
Tajima et al.

(10) Patent No.: US 12,538,513 B2
(45) Date of Patent: Jan. 27, 2026

(54) SEMICONDUCTOR DEVICE AND METHOD FOR MANUFACTURING THE SAME

(71) Applicant: KABUSHIKI KAISHA TOSHIBA, Tokyo (JP)

(72) Inventors: Jumpei Tajima, Mitaka (JP); Yosuke Kajiwara, Yokohama (JP); Po-Chin Huang, Bunkyo (JP); Toshiki Hikosaka, Kawasaki (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 631 days.

(21) Appl. No.: 17/819,770

(22) Filed: Aug. 15, 2022

(65) Prior Publication Data

US 2023/0253488 A1 Aug. 10, 2023

(30) Foreign Application Priority Data

Feb. 9, 2022 (JP) .................................. 2022-018421

(51) Int. Cl.
*H10D 30/47* (2025.01)
*H01L 21/02* (2006.01)
(Continued)

(52) U.S. Cl.
CPC ....... *H10D 30/475* (2025.01); *H01L 21/0214* (2013.01); *H01L 21/02164* (2013.01);
(Continued)

(58) Field of Classification Search
CPC ............... H10D 30/475; H10D 64/111; H10D 62/8503; H10D 30/015; H10D 62/824;
(Continued)

(56) References Cited

U.S. PATENT DOCUMENTS 9,589,951 B2 3/2017 Nagumo et al.
11,222,969 B2 * 1/2022 Iucolano .............. H10D 64/513
(Continued)

FOREIGN PATENT DOCUMENTS

JP 2007-329350 A 12/2007
JP 2010-509770 A 3/2010
(Continued)

OTHER PUBLICATIONS

IP.COM Search (Year: 2025).*
Espace.net Search (Year: 2025).*
Japanese Office Action issued Jan. 9, 2025 in Japanese Application No. 2022-018421, (with English machine translation), 14 pages.

*Primary Examiner* — Zandra V Smith
*Assistant Examiner* — Andre C Stevenson
(74) *Attorney, Agent, or Firm* — Oblon, McClelland, Maier & Neustadt, L.L.P.

(57) ABSTRACT

According to one embodiment, a semiconductor device includes first to third electrodes, first and second semiconductor regions, and a first member. The second electrode includes first and second electrode regions. A position of the third electrode is between a position of the first electrode and a position of the second electrode. The first semiconductor region includes first to fifth partial regions. The fourth partial region is between the first and third partial regions. The fifth partial region is between the third and second partial region. The second semiconductor region includes first to third semiconductor portions. At least a part of the third semiconductor portion is between the first semiconductor region and the second electrode region. The second semiconductor portion is between the first semiconductor portion and the third semiconductor region. The first member includes first and second regions.

18 Claims, 10 Drawing Sheets

(51) Int. Cl.
  *H01L 23/29* (2006.01)
  *H01L 23/31* (2006.01)
  *H10D 30/01* (2025.01)
  *H10D 62/824* (2025.01)
  *H10D 62/85* (2025.01)
  *H10D 64/00* (2025.01)

(52) U.S. Cl.
  CPC ........ *H01L 21/0217* (2013.01); *H01L 23/291* (2013.01); *H01L 23/3171* (2013.01); *H10D 30/015* (2025.01); *H10D 62/824* (2025.01); *H10D 62/8503* (2025.01); *H10D 64/111* (2025.01)

(58) Field of Classification Search
  CPC ........... H01L 21/0214; H01L 21/02164; H01L 21/0217; H01L 23/291; H01L 23/3171
  See application file for complete search history.

(56) References Cited

U.S. PATENT DOCUMENTS

2020/0105917 A1  4/2020  Okita et al.
2020/0335587 A1*  10/2020  Ono ..................... H10D 64/691

FOREIGN PATENT DOCUMENTS

| | | |
|---|---|---|
| JP | 2011-210751 A | 10/2011 |
| JP | 2013-131635 A | 7/2013 |
| JP | 2014-222763 A | 11/2014 |
| JP | 2015-220430 A | 12/2015 |
| JP | 2016-46320 A | 4/2016 |
| JP | 5985162 B2 | 9/2016 |
| JP | 2016-181570 A | 10/2016 |
| JP | 2017-123432 A | 7/2017 |
| JP | 2017-199700 A | 11/2017 |
| JP | 2020-53585 A | 4/2020 |

* cited by examiner

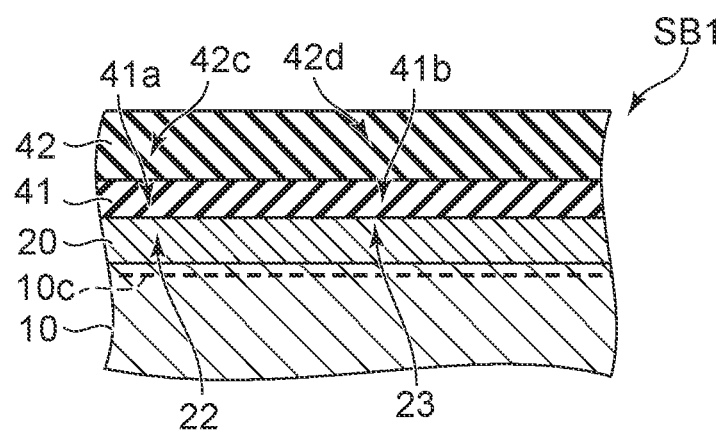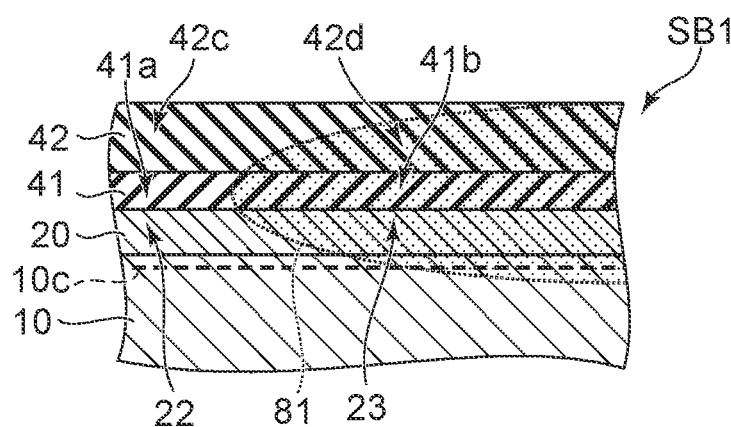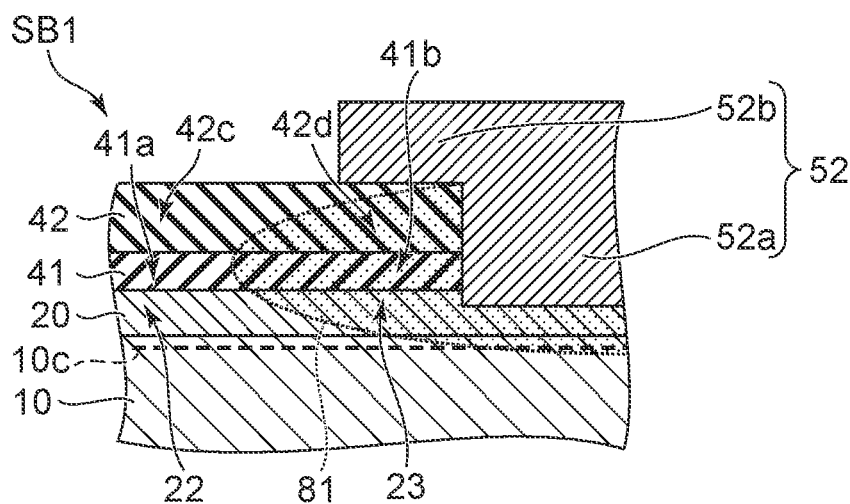

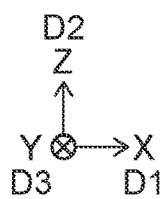
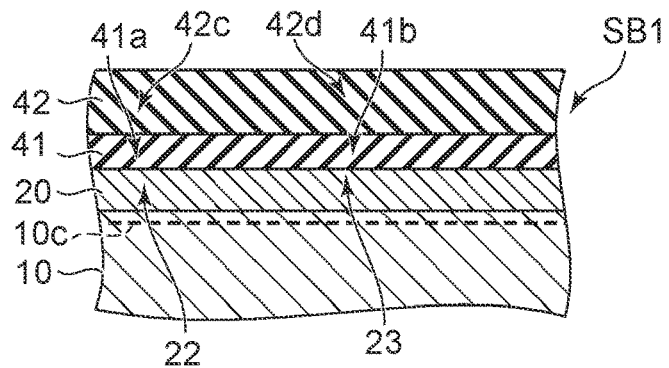
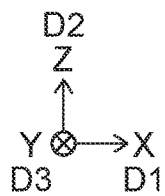
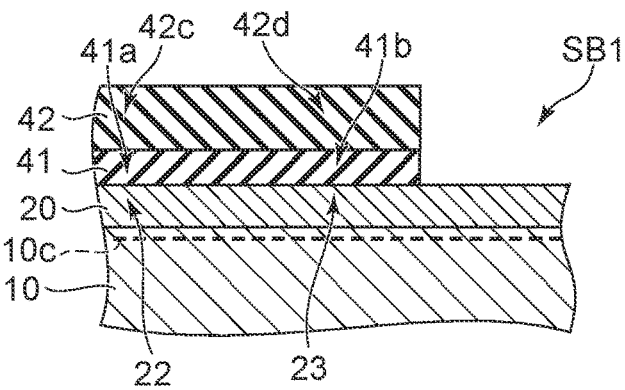
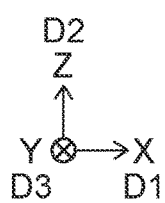
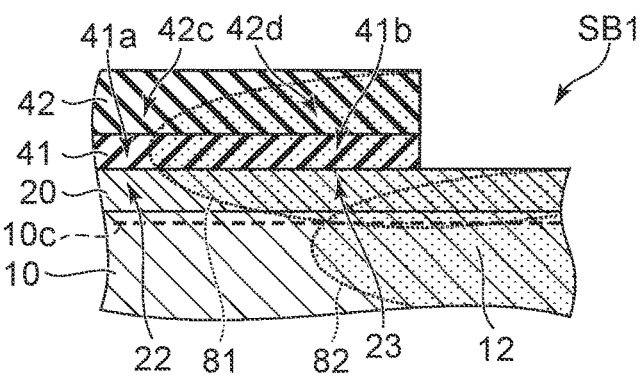
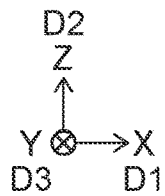
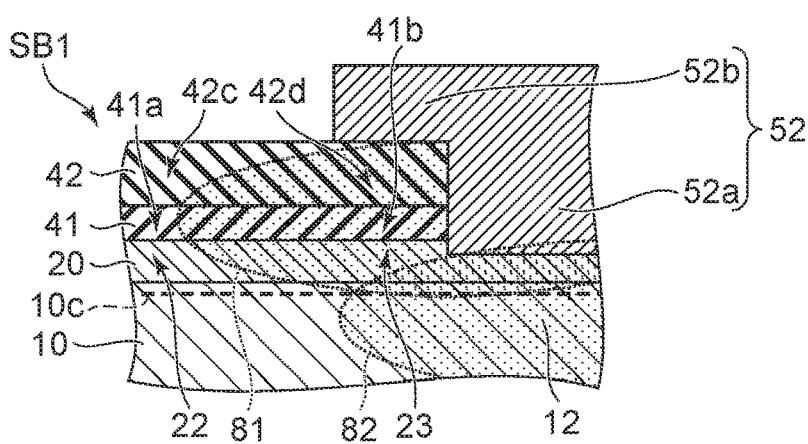

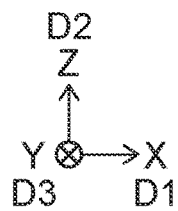
FIG. 14A
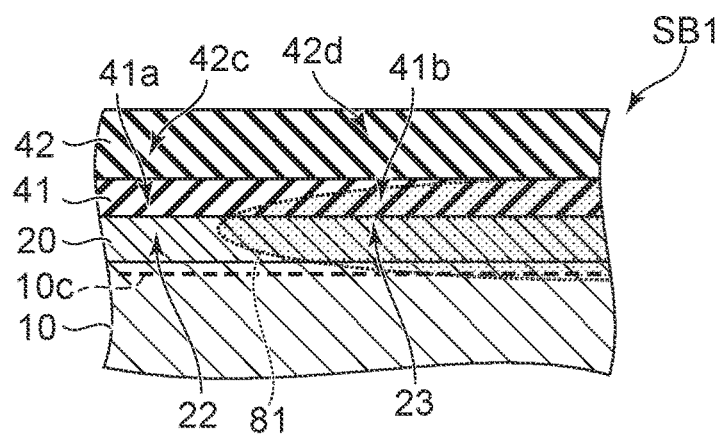
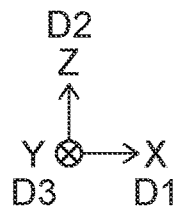
FIG. 14B
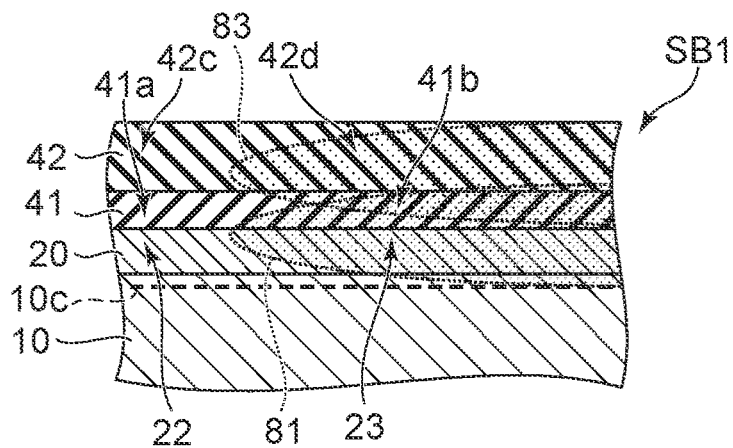
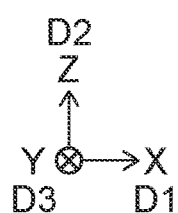
FIG. 14C
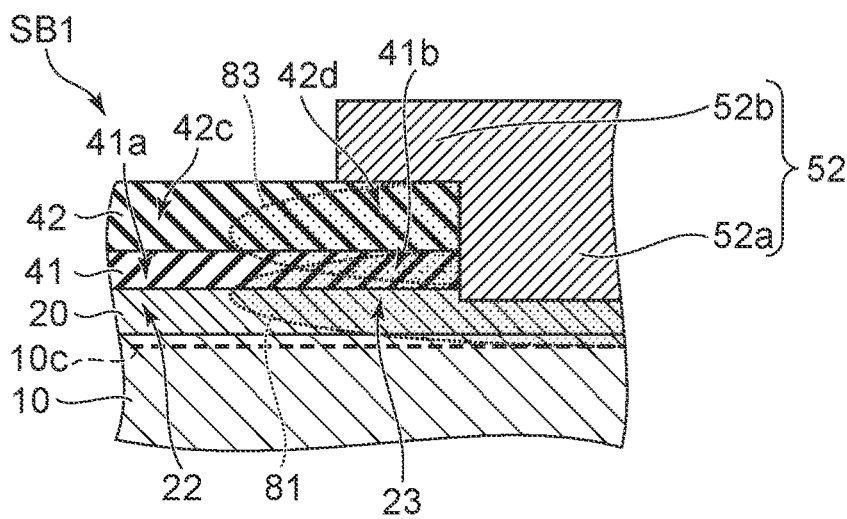

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2022-018421, filed on Feb. 9, 2022; the entire contents of which are incorporated herein by reference.

FIELD

Embodiments of the invention generally relate to a semiconductor device and a method for manufacturing the semiconductor device.

BACKGROUND

For example, in a semiconductor device such as a transistor, stable characteristics are desired.

BRIEF DESCRIPTION OF THE DRAWINGS

FIGS. 12A to 12C are schematic cross-sectional views illustrating the method for manufacturing the semiconductor device according to the second embodiment;
FIGS. 13A to 13D are schematic cross-sectional views illustrating the method for manufacturing the semiconductor device according to the second embodiment;
FIGS. 14A to 14C are schematic cross-sectional views illustrating the method for manufacturing the semiconductor device according to the second embodiment.

DETAILED DESCRIPTION

Figure 1:
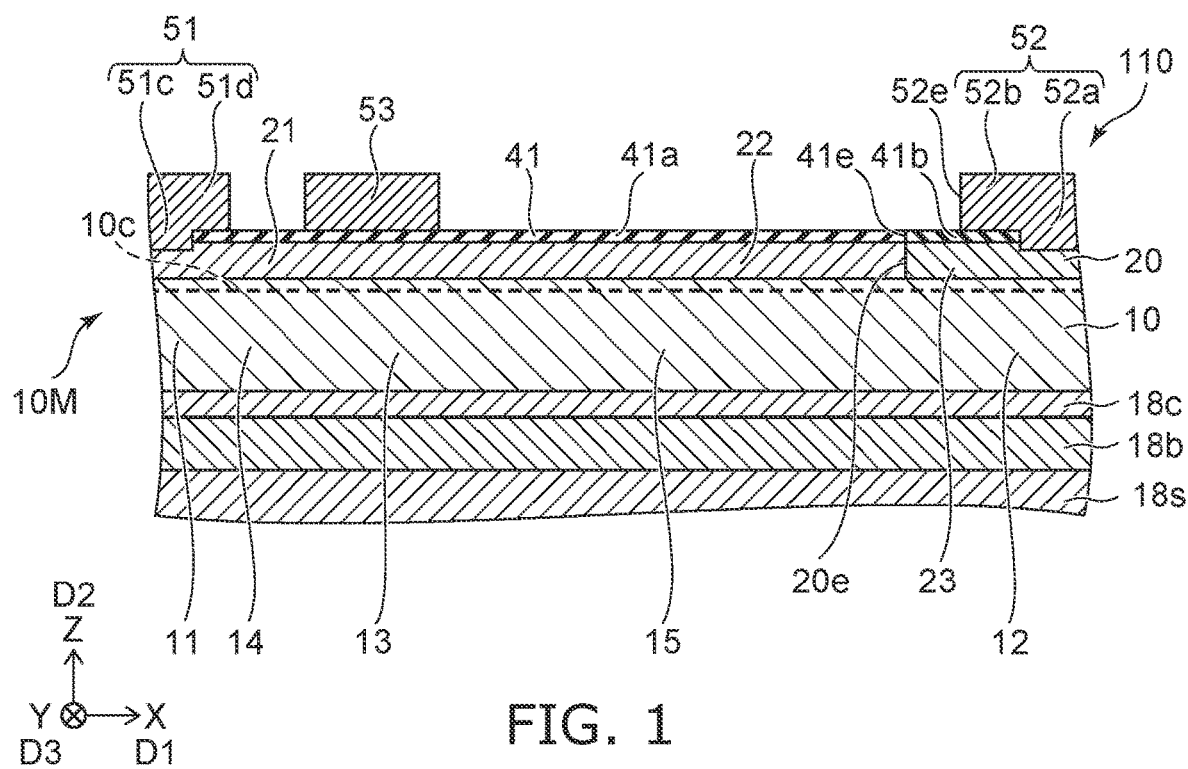
FIG. 1 is a schematic cross-sectional view illustrating a semiconductor device according to the first embodiment.

According to one embodiment, a semiconductor device includes a first electrode, a second electrode, a third electrode, a first semiconductor region, a second semiconductor region, and a first member. A direction from the first electrode to the second electrode is along a first direction. The second electrode includes a first electrode region and a second electrode region. A position of the third electrode in the first direction is between a position of the first electrode in the first direction and a position of the second electrode in the first direction. The first semiconductor region includes $Al_{x1}Ga_{1-x1}N$ ($0 \leq x1 < 1$). The first semiconductor region includes a first partial region, a second partial region, a third partial region, a fourth partial region, and a fifth partial region. A direction from the first partial region to the first electrode is along a second direction crossing the first direction. A direction from the second partial region to the second electrode is along the second direction. A direction from the third partial region to the third electrode is along the second direction. The fourth partial region is between the first partial region and the third partial region in the first direction. The fifth partial region is between the third partial region and the second partial region in the first direction. The second semiconductor region includes $Al_{x2}Ga_{1-x2}N$ ($x1 < x2 \leq 1$). The second semiconductor region includes a first semiconductor portion, a second semiconductor portion, and a third semiconductor portion. A direction from the fourth partial region to the first semiconductor portion is along the second direction. A direction from the fifth partial region to the second semiconductor portion is along the second direction. At least a part of the third semiconductor portion is between the first semiconductor region and the second electrode region in the second direction. The second semiconductor portion is between the first semiconductor portion and the third semiconductor region in the first direction. The third semiconductor portion includes silicon and the second semiconductor region does not include silicon, or a concentration of silicon in the second semiconductor portion is lower than a concentration of silicon in the third semiconductor portion. The first member includes silicon and at least one selected from the group consisting of nitrogen and oxygen. The first member includes a first region and a second region. The second semiconductor portion is between the fifth partial region and the first region in the second direction. At least a part of the second region is between the third semiconductor portion and the second electrode region in the second direction. A concentration of silicon in the second region is higher than a concentration of silicon in the first region.

According to one embodiment, a manufacturing method of a semiconductor device is disclosed. The method can include preparing a structure including a first semiconductor region, a second semiconductor region, and a first member. The first semiconductor region includes $Al_{x1}Ga_{1-x1}N$ ($0 \leq x1 < 1$). The second semiconductor region includes $Al_{x2}Ga_{1-x2}N$ ($x1 < x1 \leq 1$). The second semiconductor region is between the first semiconductor region and the first member. The first member includes silicon and at least one selected from the group consisting of nitrogen and oxygen. The first member includes a first region and a second region. A first direction from the first region to the second region crosses a second direction from the first semiconductor region to the second semiconductor region. The second semiconductor region includes a first semiconductor portion, a second semiconductor portion, and a third semiconductor portion. The second semiconductor portion is between the first semiconductor portion and the third semiconductor portion in the first direction. The second semiconductor portion overlaps the first region in the second direction. The third semiconductor portion overlaps the second region in the second direction. The method can include introducing silicon into the second region and the third semiconductor portion to cause a concentration of silicon in the second region being higher than a concentration of silicon in the first region, and to cause a concentration of silicon in the third semiconductor portion being higher than a concentration of silicon in the semiconductor portion. The method can include forming a first electrode, a second electrode and a third electrode. The first electrode is electrically connected with the first semiconductor portion. The second electrode is electrically connected with the third semiconductor portion. A part of the first member is between a part of the first semiconductor region and the third electrode. The second electrode includes a first electrode portion and a second electrode portion. At least a part of the second region is between the third semiconductor portion and the second electrode portion. A position of the third electrode in the first direction is between a position of the first electrode in the first direction and a position of the first electrode region in the first direction. A position of the second electrode portion in the first direction is between the position of the third electrode in the first direction and a position of the first electrode region in the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to the first embodiment.

As shown in FIG. 1, a semiconductor device 110 according to the embodiment includes a first electrode 51, a second electrode 52, a third electrode 53, a first semiconductor region 10, a second semiconductor region 20, and a first member 41.

A first direction D1 from the first electrode 51 to the second electrode 52 is an X-axis direction. One direction perpendicular to the X-axis direction is defined as a Z-axis direction. The direction perpendicular to the X-axis direction and the Z-axis direction is defined as a Y-axis direction.

The second electrode 52 includes a first electrode region 52a and a second electrode region 52b.

A position of the third electrode 53 in the first direction D1 is between a position of the first electrode 51 in the first direction D1 and a position of the second electrode 52 in the first direction D1. For example, the third electrode 53 is located between the first electrode 51 and the second electrode 52 in the first direction D1.

The first semiconductor region 10 includes $Al_{x1}Ga_{1-x1}N$ ($0 \leq x1 < 1$). In one example, the composition ratio x1 is not less than 0 and not more than 0.1. The first semiconductor region 10 is, for example, a GaN layer.

The first semiconductor region 10 includes a first partial region 11, a second partial region 12, a third partial region 13, a fourth partial region 14, and a fifth partial region 15. A direction from the first partial region 11 to the first electrode 51 is along a second direction D2. The second direction D2 crosses the first direction D1. The second direction D2 is, for example, the Z-axis direction.

A direction from the second partial region 12 to the second electrode 52 is along the second direction D2. A direction from the second partial region 12 to at least a part of the second electrode 52 is along the second direction D2. A direction from the third partial region 13 to the third electrode 53 is along the second direction D2. The fourth partial region 14 is between the first partial region 11 and the third partial region 13 in the first direction D1. The fifth partial region 15 is between the third partial region 13 and the second partial region 12 in the first direction D1.

The first partial region 11 is, for example, a region that overlaps the first electrode 51 in the Z-axis direction. The second partial region 12 is, for example, a region that overlaps the second electrode 52 in the Z-axis direction. The third partial region 13 is, for example, a region that overlaps the third electrode 53 in the Z-axis direction. The first to fifth partial regions 11 to 15 are continuous with each other. The boundaries between the first to fifth partial regions 11 to 15 may be unclear.

The second semiconductor region 20 includes $Al_{x2}Ga_{1-x2}N$ ($x1 < x2 \leq 1$). In one example, the composition ratio x2 is not less than 0.05 and not more than 0.35. The second semiconductor region 20 is, for example, an AlGaN layer.

The second semiconductor region 20 includes a first semiconductor portion 21, a second semiconductor portion 22, and a third semiconductor portion 23. A direction from the fourth partial region 14 to the first semiconductor portion 21 is along the second direction D2. A direction from the fifth partial region 15 to the second semiconductor portion 22 is along the second direction D2.

At least a part of the third semiconductor portion 23 is located between the first semiconductor region 10 and the second electrode region 52b in the second direction D2. For example, the second semiconductor portion 22 is located between the first semiconductor portion 21 and the third semiconductor portion 23 in the first direction D1.

For example, the third semiconductor portion 23 includes silicon, and the second semiconductor portion 22 does not include silicon. Alternatively, the concentration of silicon in the third semiconductor portion 23 is higher than the concentration of silicon in the second semiconductor portion 22. The third semiconductor portion 23 is a portion that locally includes silicon. For example, the first semiconductor portion 21 does not substantially include silicon. Alternatively, the concentration of silicon in the third semiconductor portion 23 is higher than the concentration of silicon in the first semiconductor portion 21.

For example, the first electrode 51 is electrically connected with the first semiconductor portion 21. The second electrode 52 is electrically connected with the second semiconductor portion 22.

The first member 41 includes silicon and at least one selected from the group consisting of nitrogen and oxygen. The first member 41 includes, for example, silicon nitride, silicon oxide, or silicon oxynitride. The first member 41 includes a first region 41a and a second region 41b. The second semiconductor portion 22 is located between the fifth partial region 15 and the first region 41a in the second direction D2. In this example, at least a portion of the second region 41b is between at least a portion of the first region 41a and the first electrode region 52a in the first direction D1. At least a portion of the second region 41b is between the third semiconductor portion 23 and the second electrode region 52b in the second direction D2. The concentration of silicon in the second region 41b is higher than the concentration of silicon in the first region 41a.

A part of the first member 41 is located between the third partial region 13 and the third electrode 53 in the second direction D2.

A current flowing between the first electrode 51 and the second electrode 52 can be controlled by a potential of the third electrode 53. The potential of the third electrode 53 may be, for example, a potential based on the potential of the first electrode 51. For example, a distance between the first electrode 51 and the third electrode 53 is shorter than a distance between the second electrode 52 and the third electrode 53. The first electrode 51 functions as, for example, a source electrode. The second electrode 52 functions as, for example, a drain electrode. The third electrode 53 functions as, for example, a gate electrode. The semiconductor device 110 is, for example, a transistor. The first member 41 between the third partial region 13 and the third electrode 53 functions as a gate insulating film.

The first semiconductor region 10 and the second semiconductor region 20 are included in a semiconductor member 10M. The first semiconductor region 10 includes a portion facing the second semiconductor region 20. A carrier region 10c is formed in the facing portion. The carrier region 10c is, for example, a two-dimensional electron gas. The semiconductor device 110 is, for example, a HEMT (high electron mobility transistor).

The first electrode 51, the second electrode 52, and the third electrode 53 extend along a third direction D3. The third direction D3 crosses a plane including the first direction D1 and the second direction D2. The third direction D3 is, for example, the Y-axis direction.

In this example, a part of the third semiconductor portion 23 is located between the second partial region 12 and the first electrode region 52a in the second direction D2. The part of the third semiconductor portion 23 is in contact with the first electrode region 52a. The second electrode region 52b protrudes toward the third electrode 53 with reference to the first electrode region 52a. The second electrode region 52b is a protruding portion or an eaves portion.

As shown in FIG. 1, the first electrode 51 may include a third electrode region 51c and a fourth electrode region 51d. The third electrode region 51c is in contact with, for example, the first semiconductor portion 21. The fourth electrode region 51d protrudes toward the third electrode 53 with reference to the third electrode region 51c. The fourth electrode region 51d is a protruding portion or an eaves portion. By providing these protruding portions, it is easy to obtain a stable electrode shape. For example, the margin in the manufacturing process is expanded, and a practical semiconductor device can be obtained.

As shown in FIG. 1, the semiconductor device 110 may include a base body 18s, a buffer layer 18b, and a nitride semiconductor layer 18c. The base body 18s may include, for example, a silicon substrate, a GaN substrate, a sapphire substrate, or the like. The buffer layer 18b is provided between the base body 18s and the first semiconductor region 10. The buffer layer 18b includes Al, Ga and nitrogen. The nitride semiconductor layer 18c is provided between the buffer layer 18b and the first semiconductor region 10. The nitride semiconductor layer 18c includes GaN including carbon. The concentration of carbon in the nitride semiconductor layer 18c is higher than the concentration of carbon in the first semiconductor region 10.

The buffer layer 18b is provided on the base body 18s. The nitride semiconductor layer 18c is provided on the buffer layer 18b. The first semiconductor region 10 is provided on the nitride semiconductor layer 18c. The second semiconductor region 20 is provided on the first semiconductor region 10. For example, the first electrode 51 and the second electrode 52 are provided on the second semiconductor region 20.

For example, a high voltage is applied to the second electrode 52. Electric field concentration occurs in the vicinity of the second electrode 52. The on-resistance may increase due to the local concentration of the electric field. For example, current collapse occurs. The concentration of the electric field occurs in the vicinity of the second electrode region 52b.

In the embodiment, the concentration of silicon in the second region 41b overlapping the second electrode region 52b in the second direction D2 is higher than that in the first region 41a. The locally high concentration of silicon reduces the electrical resistance in the second region 41b. As a result, the current collapse is suppressed. The increase in on-resistance can be suppressed. According to the embodiment, it is possible to provide a semiconductor device capable of obtaining stable characteristics.

In the embodiment, the third semiconductor portion 23 of the second semiconductor region 20 includes silicon. The third semiconductor portion 23 is, for example, of n-type. In the third semiconductor portion 23, the resistance is locally decreased. For example, the contact resistance between the third semiconductor portion 23 and the second electrode 52 is low. Low on-resistance is obtained.

In the embodiment, since the concentration of silicon is high in the second region 41b of the first member 41, the number of traps can be reduced in the second region 41b. Release of the carriers from the trap can be accelerated. Since the third semiconductor portion 23 of the second semiconductor region 20 includes silicon, traps can be reduced in the third semiconductor portion 23. Release of the carriers from the trap can be accelerated. Since there are few traps, the characteristics are easy to stabilize. More stable characteristics can be obtained.

In the embodiment, the concentration of silicon in the third semiconductor portion 23 is, for example, not less than $1 \times 10^{17}$ cm$^{-3}$ and not more than $1 \times 10^{21}$ cm$^{-3}$. The characteristics can be stabilized more effectively.

In the embodiment, for example, the concentration of silicon in the second region 41b is preferably 1.01 times or more the concentration of silicon in the first region 41a. The characteristics can be stabilized more effectively. For example, the concentration of silicon in the second region 41b is preferably 1.5 times or less the concentration of silicon in the first region 41a. The concentration of silicon in the second region 41b may be 1.03 times or more the concentration of silicon in the first region 41a.

As shown in FIG. 1, in this example, a part of the third semiconductor portion 23 is located between the second partial region 12 and the first electrode region 52a in the first direction D1.

In the embodiment, the concentration of silicon in the first semiconductor portion 21 may be lower than the concentration of silicon in the third semiconductor portion 23.

In the embodiment, a part of the first semiconductor region 10 may include silicon. For example, a part of the second partial region 12 includes silicon, and the fifth partial region 15 does not include silicon. Or, for example, the concentration of silicon in the part of the second partial region 12 is higher than the concentration of silicon in the fifth partial region 15.

For example, the concentration of silicon in the fourth partial region 14 may be lower than the concentration of silicon in the second partial region 12. For example, the concentration of silicon in the third partial region 13 may be lower than the concentration of silicon in the second partial region 12.

As shown in FIG. 1, the first member 41 includes a boundary 41e between the first region 41a and the second region 41b. The second semiconductor region 20 includes a boundary 20e between the second semiconductor portion 22 and the third semiconductor portion 23. The second electrode region 52b includes an end portion 52e on the side of the third electrode 53. For example, a position of the boundary 41e in the first direction D1 may be between a position of the third electrode 53 in the first direction D1 and a position of the end portion 52e in the first direction D1. For example, the position of the boundary 20e in the first direction D1 may be between the position of the third electrode 53 in the first direction D1 and the position of the end portion 52e in the first direction D1. The characteristics can be stabilized more stably.

Figure 2:
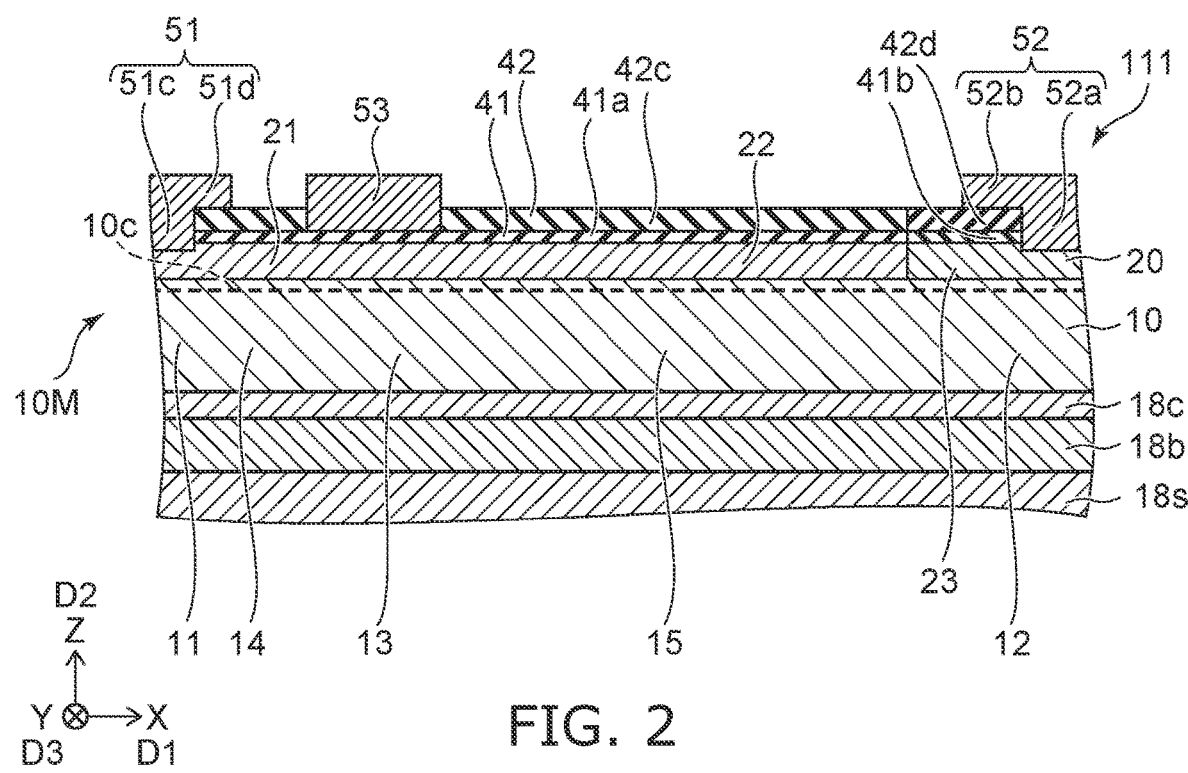
FIG. 2 is a schematic cross-sectional view illustrating the semiconductor device according to the first embodiment.

FIG. 2 is a schematic cross-sectional view illustrating the semiconductor device according to the first embodiment.

As shown in FIG. 2, a semiconductor device 111 according to the embodiment includes the second member 42. Except for this, the configuration of the semiconductor device 111 may be the same as the configuration of the semiconductor device 110.

The second member 42 includes silicon and at least one selected from the group consisting of nitrogen and oxygen. The second member 42 includes, for example, silicon nitride, silicon oxide, or silicon oxynitride. The second member 42 includes a third region 42c and a fourth region 42d. At least a portion of the fourth region 42d is located between the third region 42c and the first electrode region 52a in the first direction D1. The first region 41a is located between the fifth partial region 15 and the third region 42c in the second direction D2. At least a part of the fourth region 42d is located between the second region 41b and the second electrode region 52b in the second direction D2. The second member 42 functions as, for example, an interlayer insulating film.

In the embodiment, the concentration of silicon in the fourth region 42d is higher than the concentration of silicon in the third region 42c. As a result, the change in the on-resistance can be suppressed more effectively.

Figure 3:
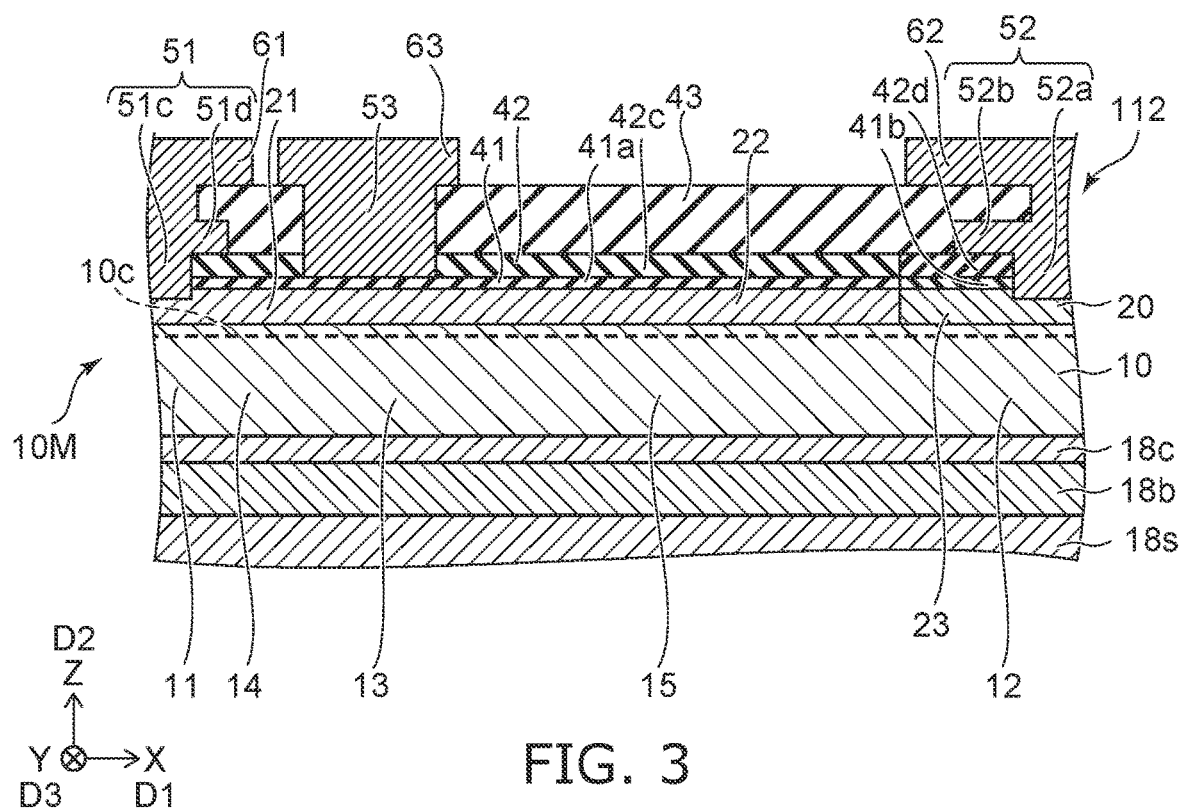
FIG. 3 is a schematic cross-sectional view illustrating the semiconductor device according to the first embodiment.

In the semiconductor device 111, the concentration of silicon in the fourth region 42d is preferably 1.01 times or more the concentration of silicon in the third region 42c, for example. As a result, the change in the on-resistance can be suppressed more stably. The concentration of silicon in the fourth region 42d may be, for example, 1.03 times or more the concentration of silicon in the third region 42c. The concentration of silicon in the fourth region 42d may be 1.5 times or less the concentration of silicon in the third region 42c. As a result, deterioration of reliability can be suppressed in the semiconductor device. FIG. 3 is a schematic cross-sectional view illustrating the semiconductor device according to the first embodiment.

As shown in FIG. 3, a semiconductor device 112 according to the embodiment includes a third member 43. Except for this, the configuration of the semiconductor device 112 may be the same as the configuration of the semiconductor device 111.

The third member 43 includes silicon and at least one selected from the group consisting of nitrogen and oxygen. The third member 43 includes, for example, silicon nitride, silicon oxide, or silicon oxynitride. The third region 42c is located between the first region 41a and a part of the third member 43 in the second direction D2. The fourth region 42d is located between the second region 41b and a part of the third member 43 in the second direction D2. The second electrode region 52b is located between the fourth region 42d and a part of the third member 43 in the second direction D2. The third member 43 functions as, for example, an interlayer insulating film.

In this example, the semiconductor device 112 includes a second conductive member 62. The second conductive member 62 is electrically connected with the second electrode 52. A part of the third member 43 is provided between the second electrode region 52b and the second conductive member 62 in the second direction D2. The second conductive member 62 functions as, for example, a field plate. For example, the concentration of the electric field can be suppressed. The characteristics can be more stabilized.

As shown in FIG. 3, the semiconductor device 112 may include a first conductive member 61 and a third conductive member 63. The first conductive member 61 is electrically connected with the first electrode 51. The third conductive member 63 is electrically connected with the third electrode 53. A part of the third member 43 is located between the first semiconductor portion 21 and the first conductive member 61 and between the second semiconductor portion 22 and the third conductive member 63 in the second direction D2. The first conductive member 61 and the third conductive member 63 function as field plates.

The first member 41 may be formed by, for example, LP-CVD (Low-Pressure Chemical Vapor Deposition). At least one of the second member 42 and the third member 43 may be formed by PE-CVD (Plasma-Enhanced Chemical Vapor Deposition).

Figure 4:
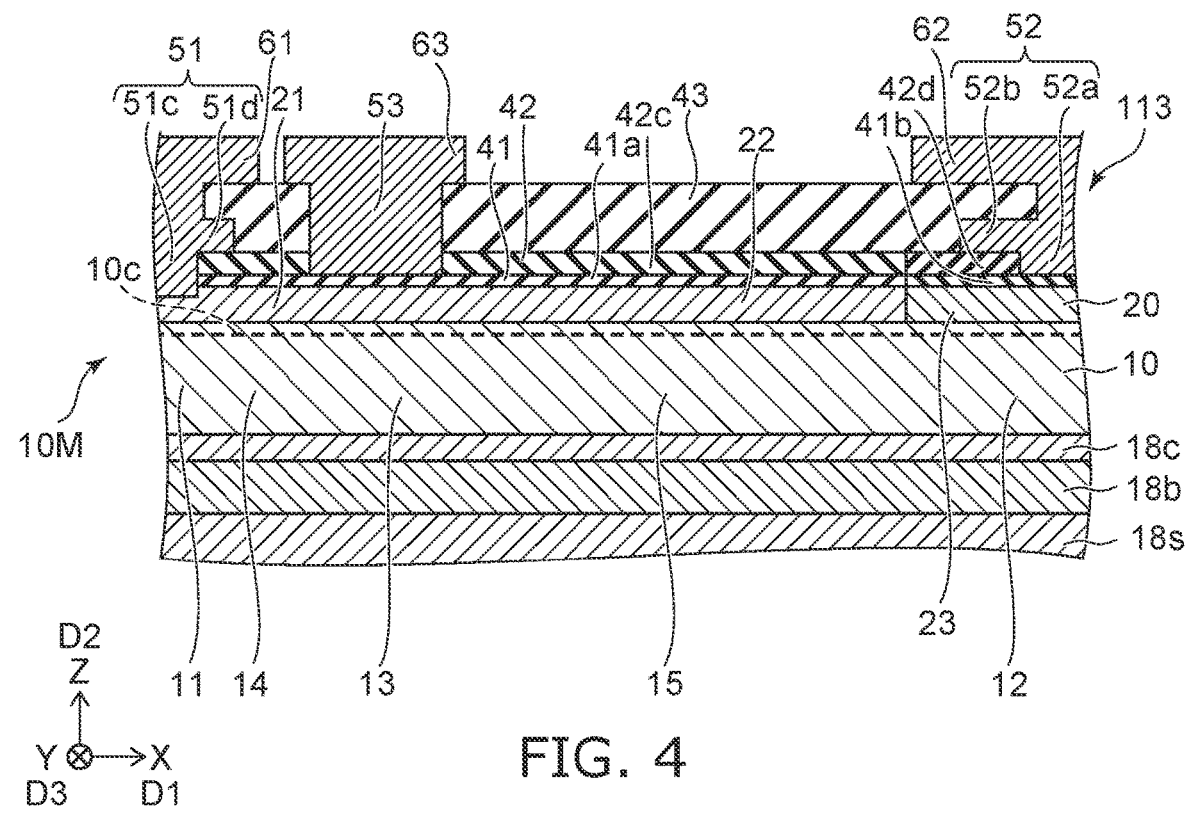
FIG. 4 is a schematic cross-sectional view illustrating the semiconductor device according to the first embodiment.

FIG. 4 is a schematic cross-sectional view illustrating the semiconductor device according to the first embodiment.

As shown in FIG. 4, in a semiconductor device 113 according to the embodiment, a part of the second region 41b is located between the second partial region 12 and the first electrode region 52a in the second direction D2. Except for this, the configuration of the semiconductor device 113 may be the same as the configuration of the semiconductor devices 110 to 112 and the like.

In the second region 41b, as described above, the concentration of silicon is high. The conductivity of the second region 41b is high. The second electrode 52 is electrically connected with the second semiconductor region 20 (the third semiconductor portion 23) via the second region 41b. Good ohmic connection is obtained. For example, low on-resistance is obtained.

FIGS. 5 to 8 are schematic cross-sectional views illustrating the semiconductor device according to the first embodiment.

In these figures, the region near the second electrode 52 in the embodiment is enlarged and illustrated.

Figure 5:
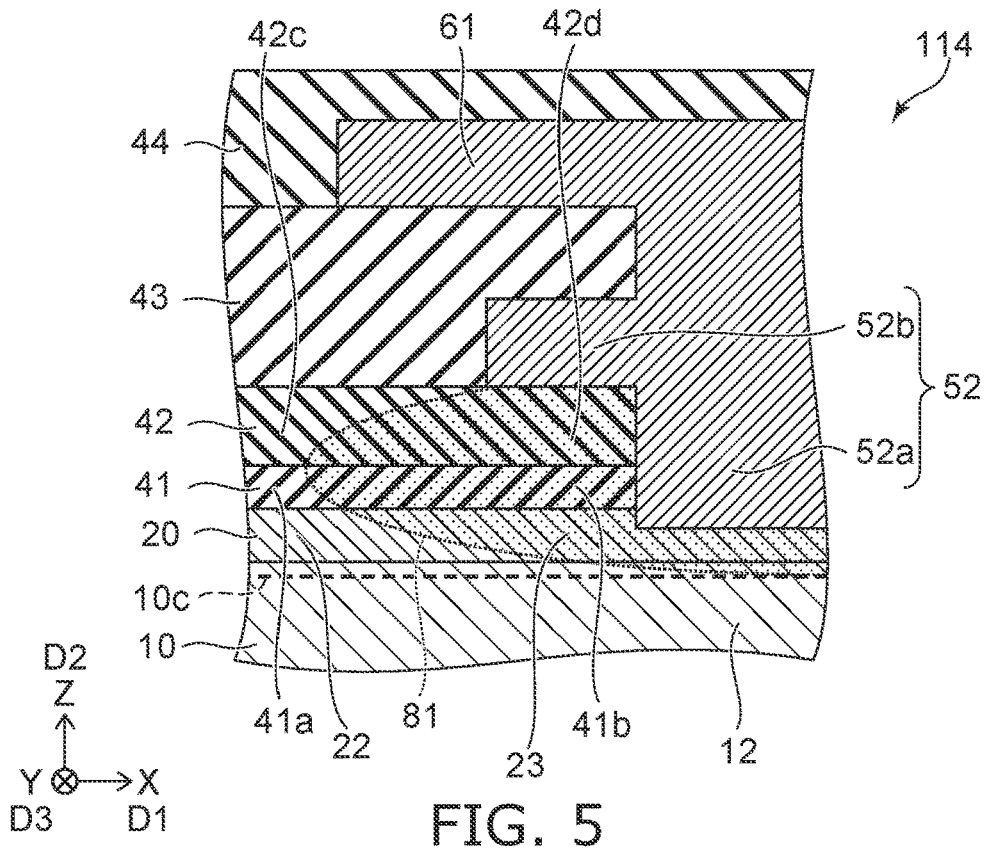
FIG. 5 is a schematic cross-sectional view illustrating the semiconductor device according to the first embodiment.

As shown in FIG. 5, in a semiconductor device 114 according to the embodiment, a first high silicon concentration region 81 is provided. The first high silicon concentration region 81 can be formed by, for example, ion implantation. The first high silicon concentration region 81 provides the third semiconductor portion 23, the second region 41b and the fourth region 42d. In the semiconductor device 114, a position of the end of the first high silicon concentration region 81 in the first direction D1 in the second direction D2 exists at a position corresponding to the first member 41.

Figure 6:
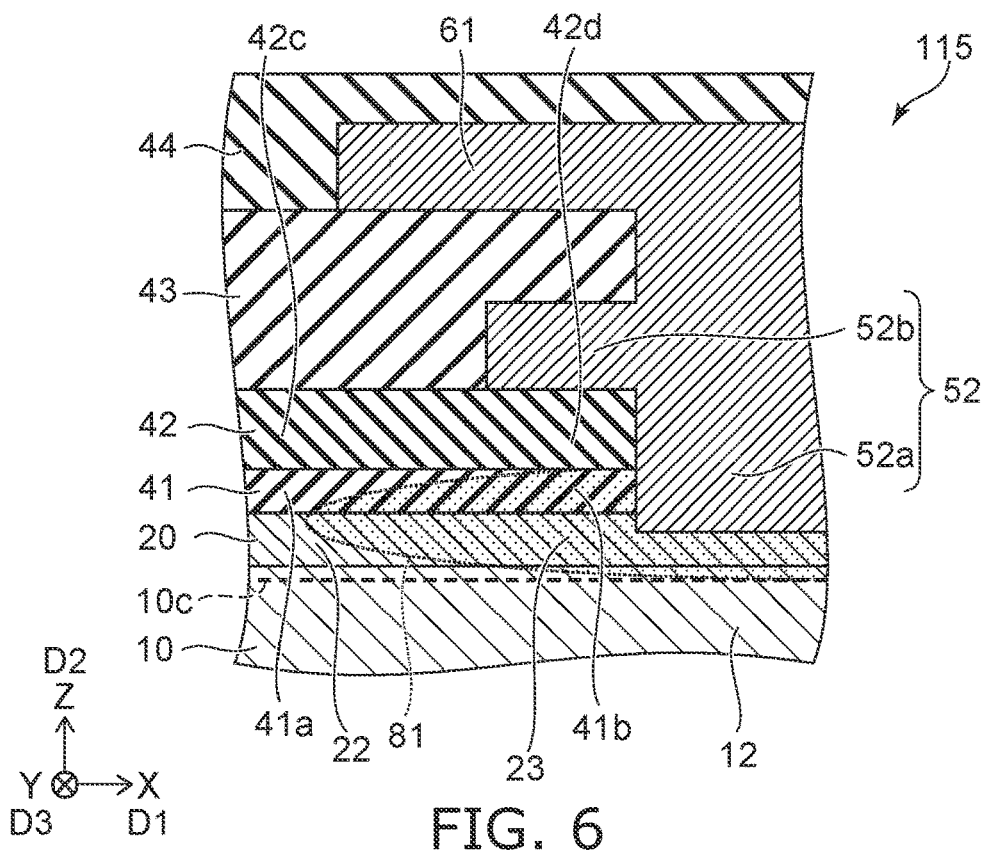
FIG. 6 is a schematic cross-sectional view illustrating the semiconductor device according to the first embodiment.

As shown in FIG. 6, in a semiconductor device 115 according to the embodiment, the first high silicon concentration region 81 is provided. In the semiconductor device 115, the position of the end of the first high silicon concentration region 81 in the first direction D1 in the second direction D2 exists at a position corresponding to the second semiconductor region 20.

Figure 7:
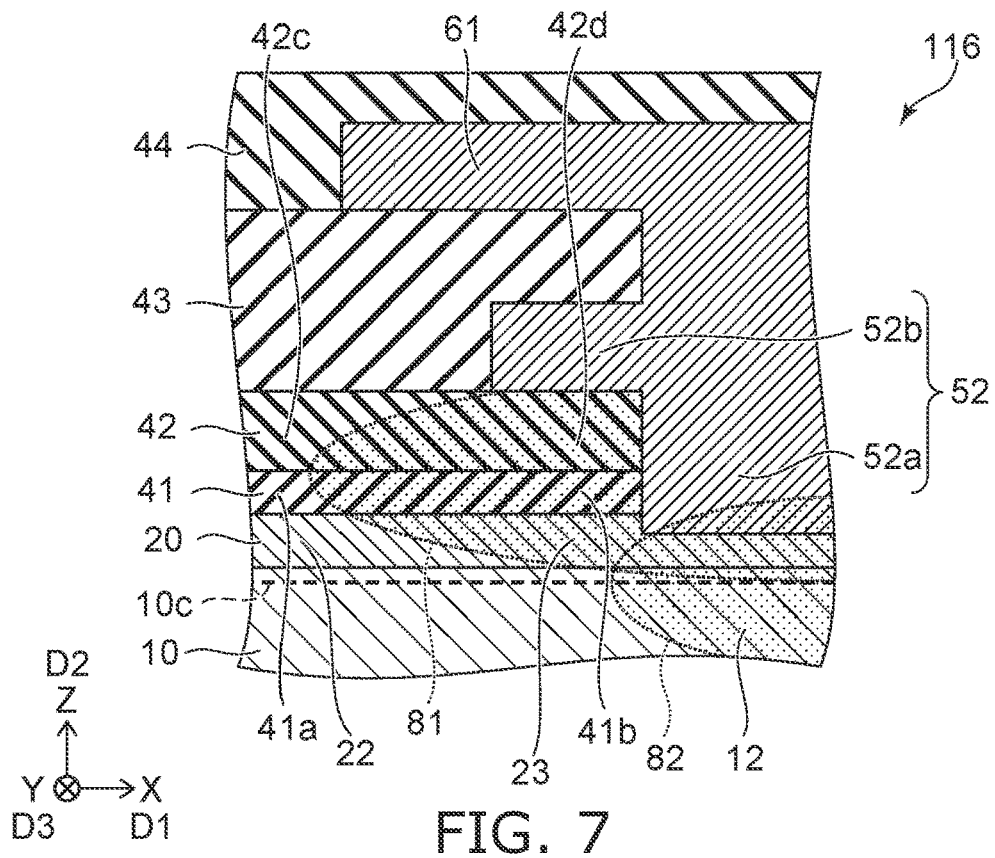
FIG. 7 is a schematic cross-sectional view illustrating the semiconductor device according to the first embodiment.

As shown in FIG. 7, in a semiconductor device 116 according to the embodiment, a second high silicon concentration region 82 is provided in addition to the first high silicon concentration region 81. The second high silicon concentration region 82 can be formed by, for example, ion implantation. The second high silicon concentration region 82 provides a high silicon concentration portion of the third semiconductor portion 23 and the second partial region 12. In this example, the position of the end of the second high silicon concentration region 82 in the first direction D1 in the second direction D2 exists at a position corresponding to the first semiconductor region 10.

Figure 8:
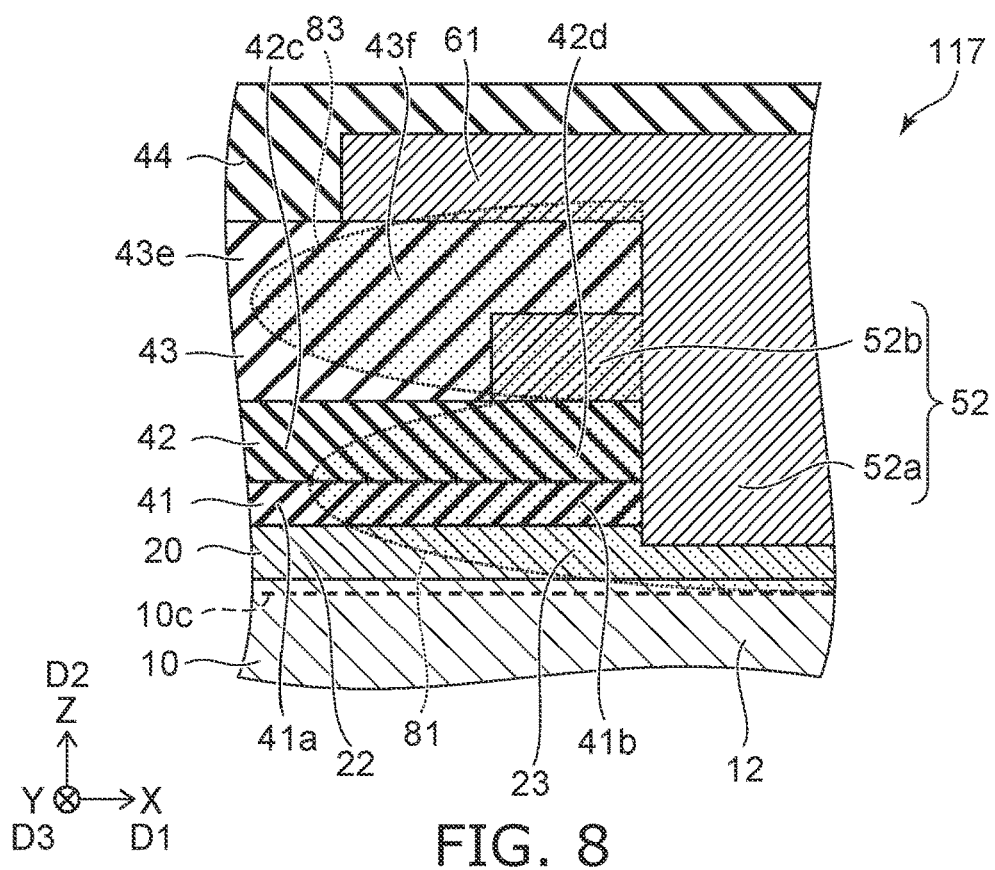
FIG. 8 is a schematic cross-sectional view illustrating the semiconductor device according to the first embodiment.

As shown in FIG. 8, in a semiconductor device 117 according to the embodiment, a third high silicon concentration region 83 is provided in addition to the first high silicon concentration region 81. The third high silicon concentration region 83 can be formed by, for example, ion implantation. In the semiconductor device 117, the position of the end of the first high silicon concentration region 81 in the first direction D1 in the second direction D2 exists at a position corresponding to the first member 41. The position of the end of the third high silicon concentration region 83 in the first direction D1 in the second direction D2 exists at a position corresponding to the third member 43.

As shown in FIG. 8, the third member 43 may include a fifth region 43e and a sixth region 43f. At least a part of the sixth region 43f is located between the third region 42c and the first conductive member 61 in the second direction D2. The third region 42c is located between the first region 41a and the fifth region 43e in the second direction D2. At least a portion of the fourth region 42d is located between the second region 41b and the sixth region 43f in the second direction D2. The concentration of silicon in the sixth region 43f is higher than the concentration of silicon in the fifth region 43e. As a result, the change in the on-resistance can be suppressed more effectively.

Figure 9:
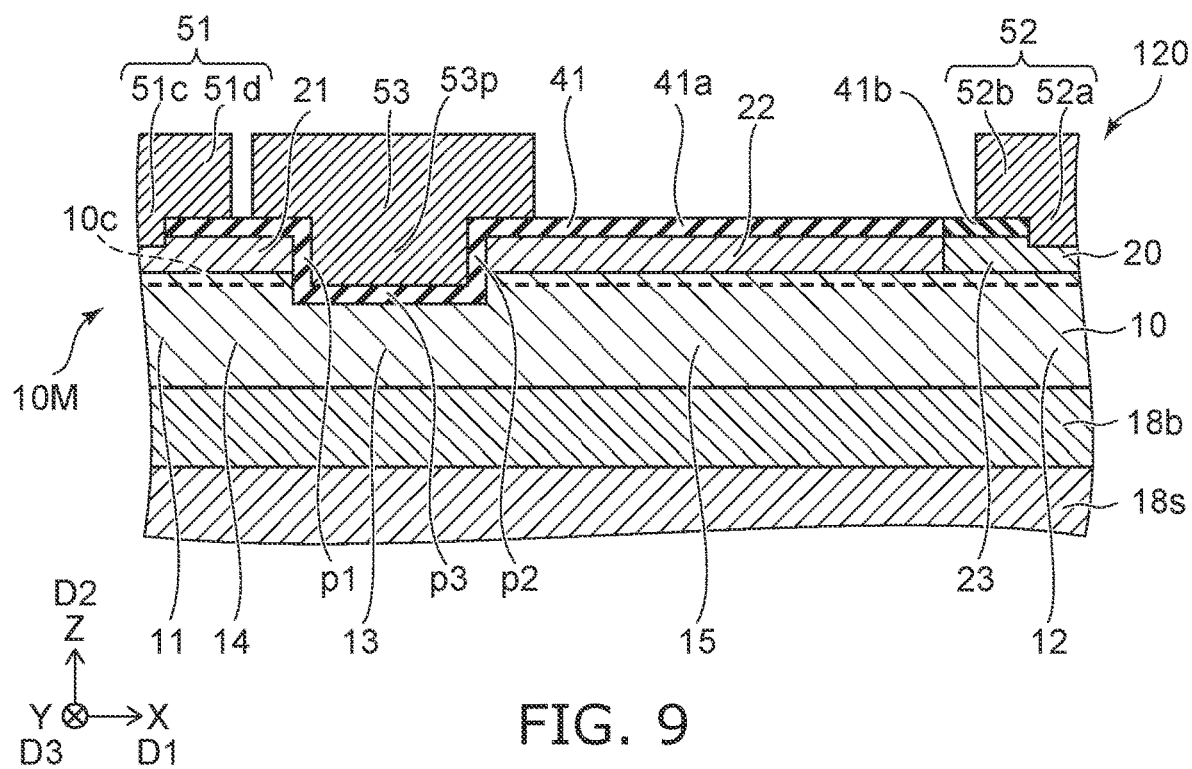
FIG. 9 is a schematic cross-sectional view illustrating the semiconductor device according to the first embodiment.

FIG. 9 is a schematic cross-sectional view illustrating the semiconductor device according to the first embodiment.

As shown in FIG. 9, in a semiconductor device 120 according to the embodiment, a part of the third electrode 53 (the first electrode portion 53p) is provided located between two portions of the second semiconductor region 20 in the first direction D1. Except for this, the configuration of the semiconductor device 120 may be the same as the configuration of the semiconductor devices 110 to 117 and the like.

In the semiconductor device 120, at least a part of the third electrode 53 (for example, the first electrode portion 53p) is located between the first semiconductor portion 21 and the second semiconductor portion 22 in the first direction D1. The third electrode 53 is, for example, a recess type gate electrode. For example, a high threshold voltage can be obtained. For example, characteristic of normally-off is obtained.

As shown in FIG. 9, a part of the third electrode 53 (for example, the first electrode portion 53p) is located between the fourth partial region 14 and the fifth partial region 15 in the first direction D1. A high threshold voltage can be obtained more stably.

Also in the semiconductor device 120, the first member 41 includes the first region 41a and the second region 41b. The concentration of silicon in the second region 41b is higher than the concentration of silicon in the first region 41a.

In the semiconductor device 120, the first member 41 includes a first portion p1, a second portion p2, and a third portion p3. The first portion p1 is located between the first semiconductor portion 21 and at least a part of the third electrode 53 (for example, the first electrode portion 53p) in the first direction D1. The second portion p2 is located between at least a part of the third electrode 53 (for example, the first electrode portion 53p) and the second semiconductor portion 22 in the first direction D1. The third portion p3 is located between the third partial region 13 and at least a part of the third electrode 53 (for example, the first electrode portion 53p) in the second direction D2.

The first member 41 electrically insulates between the semiconductor member 10M and the third electrode 53. The third portion p3 is continuous with the first region 41a.

Figure 10:
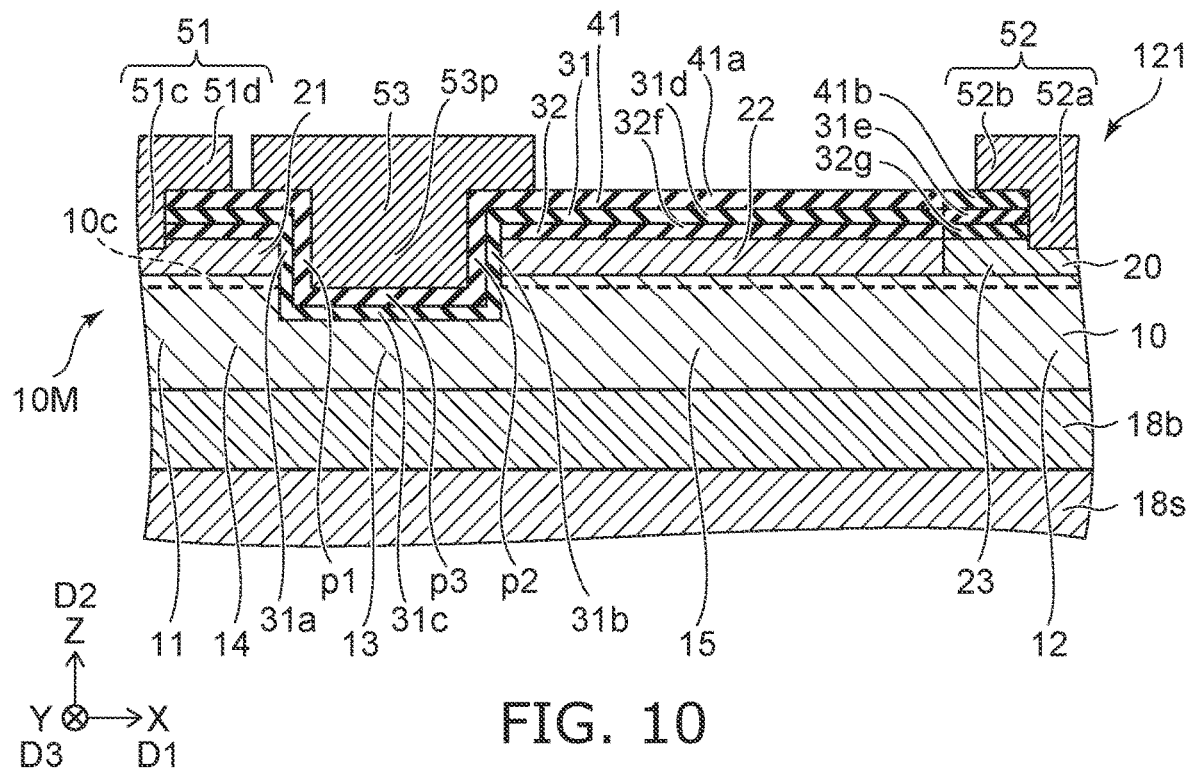
FIG. 10 is a schematic cross-sectional view illustrating the semiconductor device according to the first embodiment.

FIG. 10 is a schematic cross-sectional view illustrating the semiconductor device according to the first embodiment.

As shown in FIG. 10, a semiconductor device 121 according to the embodiment includes the first compound member 31. Except for this, the configuration of the semiconductor device 121 may be the same as the configuration of the semiconductor device 120.

The first compound member 31 includes $Al_{x1}Ga_{1-x1}N$ ($0 \le x1 < 1$). The first compound member 31 is, for example, AlN or AlGaN. The composition ratio y1 is higher than, for example, the composition ratio x2. The composition ratio y1 is not less than 0.5 and not more than 1.

The first compound member 31 includes a first compound region 31a, a second compound region 31b, and a third compound region 31c. The first compound region 31a is located between the first semiconductor portion 21 and the first portion p1 in the first direction D1. The second compound region 31b is located between the second portion p2 and the second semiconductor portion 22 in the first direction D1. The third compound region 31c is located between the third partial region 13 and the third partial p3 in the second direction D2. By providing the first compound member 31, for example, high carrier mobility can be easily obtained. For example, low on-resistance is obtained.

The first compound member 31 may include a fourth compound region 31d and a fifth compound region 31e. The fourth compound region 31d is located between the second semiconductor portion 22 and the first region 41a in the second direction D2. The fifth compound region 31e is located between the third semiconductor portion 23 and the second region 41b in the second direction D2. For example, the fifth compound region 31e includes silicon and the fourth compound region 31d does not include silicon. Alternatively, the concentration of silicon in the fifth compound region 31e is higher than the concentration of silicon in the fourth compound region 31d.

The fifth compound region 31e overlaps the second electrode region 52b in the second direction D2. The locally high concentration of silicon in the fifth compound region 31e reduces the electrical resistance in the fifth compound region 31e. For example, the current collapse is suppressed. The increase in the on-resistance can be suppressed.

As shown in FIG. 10, the semiconductor device 121 may include a second compound member 32. The second compound member 32 includes, for example, silicon and at least one selected from the group consisting of nitrogen and oxygen. The second compound member 32 includes, for example, silicon nitride, silicon oxide, or silicon oxynitride. The second compound member 32 includes a sixth compound region 32f and a seventh compound region 32g. The sixth compound region 32f is located between the second semiconductor portion 22 and the fourth compound region 31d in the second direction D2. The seventh compound region 32g is located between the third semiconductor portion 23 and the fifth compound region 31e in the second direction D2.

By providing the second compound member 32, for example, the second semiconductor region 20 is protected. In the embodiment, for example, the seventh compound region 32g includes silicon and the sixth compound region 32f does not include silicon. Alternatively, the concentration of silicon in the seventh compound region 32g is higher than the concentration of silicon in the sixth compound region 32f.

The seventh compound region 32g overlaps the second electrode region 52b in the second direction D2. The locally high concentration of silicon in the seventh compound region 32g reduces the electrical resistance in the seventh compound region 32g. For example, the current collapse is suppressed. The increase in the on-resistance can be suppressed.

Second Embodiment

The second embodiment relates to a method for manufacturing a semiconductor device. Hereinafter, some examples of the method for manufacturing the semiconductor device will be described.

FIGS. 11A to 11D are schematic cross-sectional views illustrating the method for manufacturing the semiconductor device according to the second embodiment.

Figure 11A:
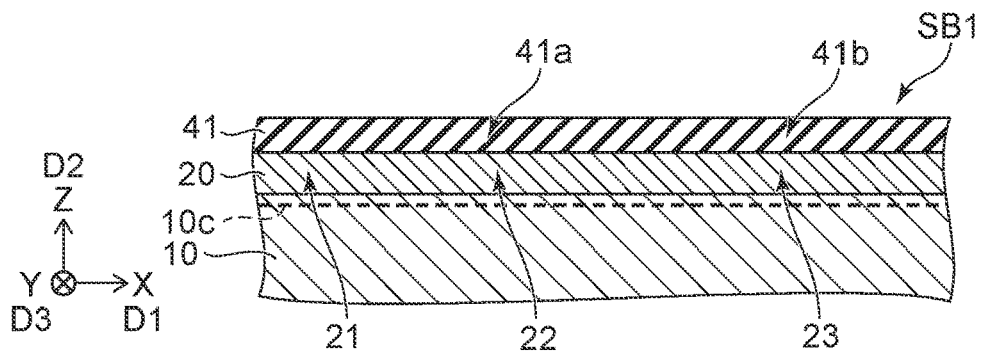
FIGS. 11A to 11D are schematic cross-sectional views illustrating a method for manufacturing the semiconductor device according to the second embodiment.

As shown in FIG. 11A, a structure SB1 is prepared. The structure SB1 includes a first semiconductor region 10 including $Al_{x1}Ga_{1-x1}N$ ($0 \le x1 < 1$), a second semiconductor region 20 including $Al_{x2}Ga_{1-x2}N$ ($x1 < x2 \le 1$), and a first member 41. The second semiconductor region 20 is located between the first semiconductor region 10 and the first member 41. The first member 41 includes silicon and at least one selected from the group consisting of nitrogen and oxygen.

The first member 41 includes a first region 41a and a second region 41b. The first direction D1 from the first region 41a to the second region 41b crosses the second direction D2 from the first semiconductor region 10 to the second semiconductor region 20.

The second semiconductor region 20 includes a first semiconductor portion 21, a second semiconductor portion 22, and a third semiconductor portion 23. The second semiconductor portion 22 is located between the first semiconductor portion 21 and the third semiconductor portion 23 in the first direction D1. The second semiconductor portion 22 overlaps the first region 41a in the second direction D2. The third semiconductor portion 23 overlaps the second region 41b in the second direction D2.

Figure 11B:
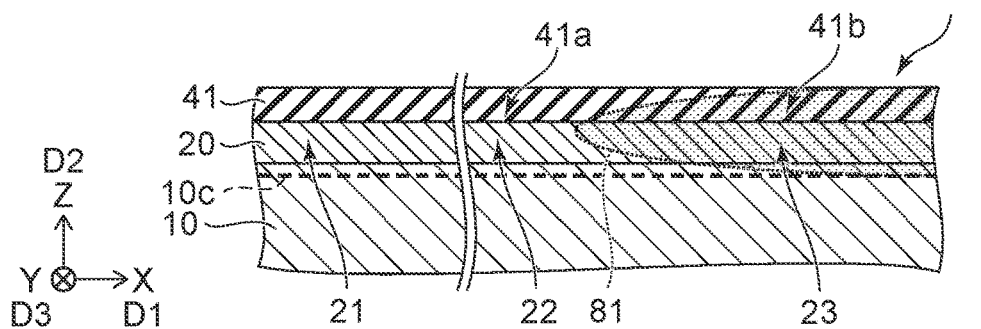

As shown in FIG. 11B, silicon is introduced into the second region 41b and the third semiconductor portion 23. For example, ion implantation is performed. As a result, a first high silicon concentration region 81 is formed. By this treatment, the concentration of silicon in the second region 41b is made higher than the concentration of silicon in the first region 41a. The concentration of silicon in the third semiconductor portion 23 is made higher than the concentration of silicon in the second semiconductor portion 22. After this, heat treatment is performed. As a result, activation is performed.

Figure 11C:
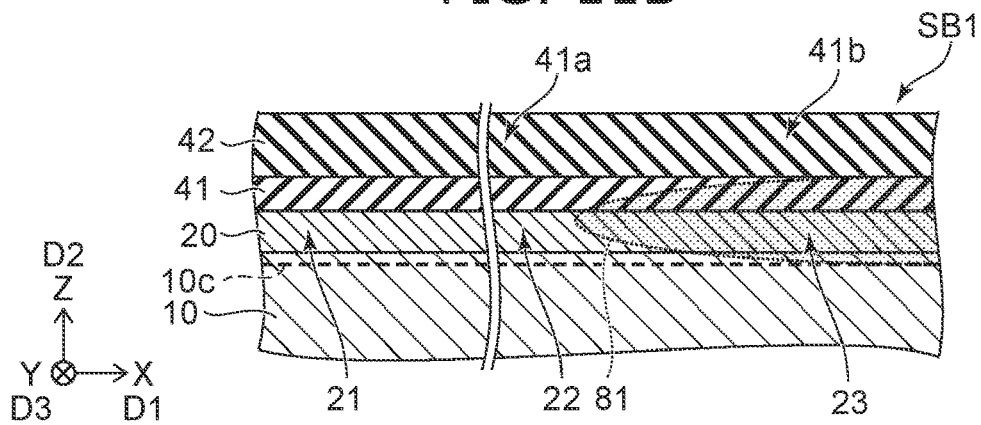

As shown in FIG. 11C, the second member 42 may be formed. At least a part of the electrode may be formed before the formation of the second member 42.

Figure 11D:
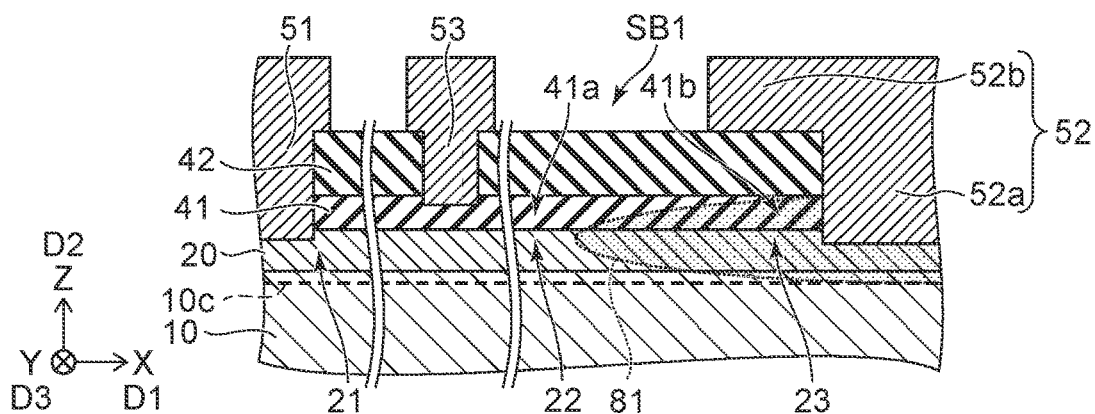

As shown in FIG. 11D, after removing a part of the structure SB1, the first electrode 51, the second electrode 52, and the third electrode 53 are formed. The first electrode 51 is electrically connected with the first semiconductor portion 21. The second electrode 52 is electrically connected with the third semiconductor portion 23. A part of the first member 41 is located between a part of the first semiconductor region 10 and the third electrode 53.

The second electrode 52 includes a first electrode region 52a and a second electrode region 52b. At least a part of the second region 41b is located between the third semiconductor portion 23 and the second electrode region 52b. A position of the third electrode 53 in the first direction D1 is between a position of the first electrode 51 in the first direction D1 and a position of the first electrode region 52a in the first direction D1. A position of at least a part of the second electrode region 52b in the first direction D1 is between the position of the third electrode 53 in the first direction D1 and a position of the first electrode region 52a in the first direction D1.

According to the manufacturing method according to the embodiment, the second region 41b and the third semiconductor portion 23 having a high concentration of silicon can be formed under the second electrode region 52b. It is possible to manufacture a semiconductor device capable of obtaining stable characteristics.

Hereinafter, some other examples of the manufacturing method of the semiconductor device related to the embodiment will be described. Below, states in the vicinity of the second electrode 52 are illustrated. The state of the portion including the first electrode 51 and the third electrode 53 may be the same as the state described with respect to FIGS. 11A to 11D. In the following, same portions as those of FIGS. 11A to 11D will be omitted.

FIGS. 12A to 12C are schematic cross-sectional views illustrating the method for manufacturing the semiconductor device according to the second embodiment.

As shown in FIG. 12A, in this example, the structure SB1 also includes the second member 42. The second member 42 includes a third region 42c and a fourth region 42d.

As shown in FIG. 12B, silicon is introduced into the fourth region 42d, the second region 41b, and the third semiconductor portion 23. For example, ion implantation is performed. As a result, the first high silicon concentration region 81 is formed.

By the formation of the first high silicon concentration region 81, the concentration of silicon in the second region 41b becomes higher than the concentration of silicon in the first region 41a. The concentration of silicon in the third semiconductor portion 23 becomes higher than the concentration of silicon in the second semiconductor portion 22. After this, heat treatment is performed. As a result, activation is performed.

As shown in FIG. 12C, after removing a part of the structure SB1, the first electrode 51, the second electrode 52, and the third electrode 53 are formed.

FIGS. 13A to 13D are schematic cross-sectional views illustrating the method for manufacturing the semiconductor device according to the second embodiment.

As shown in FIG. 13A, in this example, the structure SB1 also includes the second member 42.

As shown in FIG. 13B, a part of the structure SB1 is removed. As a result, a part of the second member 42 and a part of the first member 41 are removed. This removal is done prior to an introduction of silicon.

As shown in FIG. 13C, silicon is introduced. In this example, the first high silicon concentration region 81 and the second high silicon concentration region 82 are formed. These regions are formed by multiple ion implantations.

That is, silicon is introduced into the fourth region 42d included in the second member 42, which remains after the removal of a part of the second member 42. Silicon is introduced into the second region 41b included in the first member 41, which remains after the removal of a part of the first member 41. The second high silicon concentration region 82 locally increases the concentration of silicon in the second partial region 12 of the first semiconductor region 10.

As shown in FIG. 13D, electrodes (the first to third electrodes 51 to 53) are formed.

FIGS. 14A to 14C are schematic cross-sectional views illustrating the method for manufacturing the semiconductor device according to the second embodiment.

As shown in FIG. 14A, in this example, the structure SB1 also includes the second member 42. As shown in FIG. 14A, silicon is introduced. That is, the first high silicon concentration region 81 is formed. The first high silicon concentration region 81 is formed by ion implantation. After this, activation by heat treatment is performed.

As shown in FIG. 14B, a second introduction of silicon is performed. The third high silicon concentration region 83 is formed. The third high silicon concentration region 83 is formed by ion implantation. Activation is performed by heat treatment. As shown in FIG. 14C, electrodes (the first to third electrodes 51 to 53) are formed.

Figure 15A:
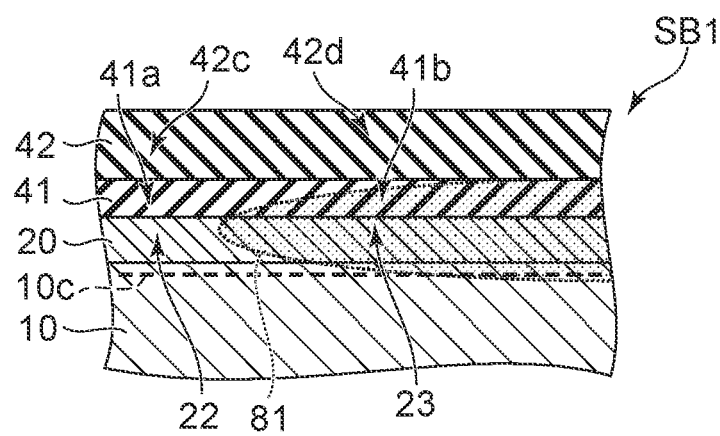
FIGS. 15A to 15C are schematic cross-sectional views illustrating the method for manufacturing a semiconductor device according to the second embodiment.
Figure 15B:
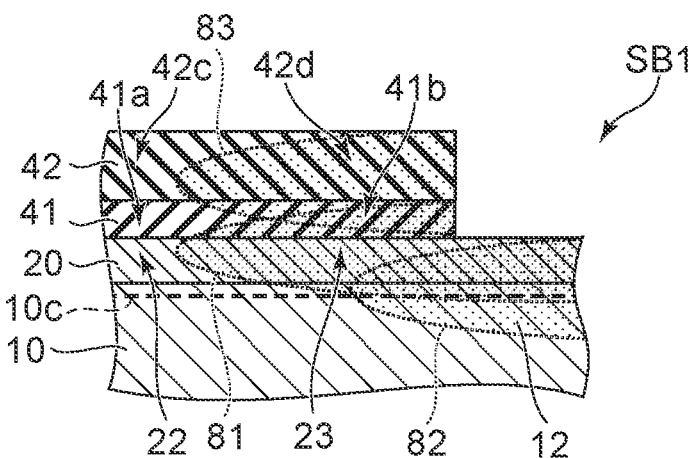
Figure 15C:
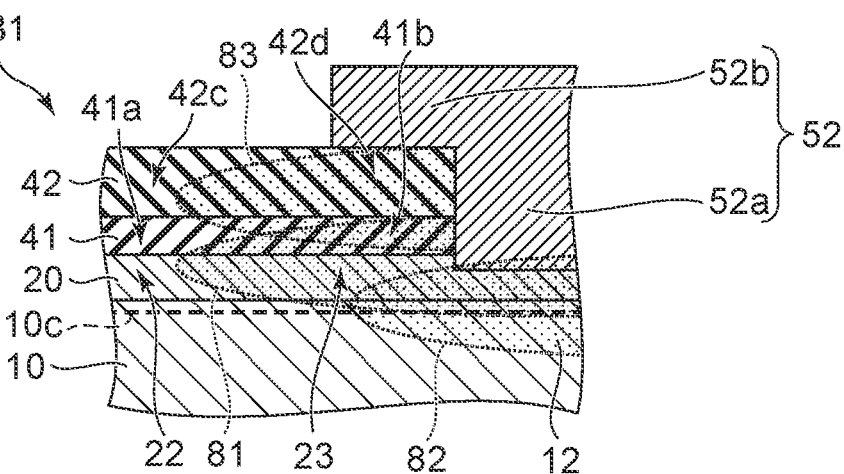

FIGS. 15A to 15C are schematic cross-sectional views illustrating the method for manufacturing the semiconductor device according to the second embodiment.

As shown in FIG. 15A, in this example, the structure SB1 also includes the second member 42. As shown in FIG. 15A, silicon is introduced. That is, the first high silicon concentration region 81 is formed. The first high silicon concentration region 81 is formed by ion implantation. After this, activation by heat treatment is performed.

As shown in FIG. 15B, a part of the structure SB1 is removed. The second high silicon concentration region 82 and the third high silicon concentration region 83 are formed by ion implantation. After this, activation by heat treatment is performed. As shown in FIG. 15C, electrodes (the first to third electrodes 51 to 53) are formed.

The semiconductor devices according to the embodiment can be manufactured by various steps as described above.

For example, a material of the first electrode 51 may be the same as a material of the second electrode 52. For example, the first electrode 51 may include at least one first element selected from the group consisting of Ti, Al, Ga, Ni, Nb, Mo, Ta, Hf, V and Au.

The third electrode 53 includes, for example, at least one selected from the group consisting of TiN, WN, Ni, Au, Pt and Ti. The third electrode 53 may include, for example, conductive silicon or polysilicon.

Information on length and thickness can be obtained by observing with an electron microscope. Information on the composition of the material can be obtained by SIMS (Secondary Ion Mass Spectrometry) or EDX (Energy dispersive X-ray spectroscopy).

According to the embodiment, it is possible to provide a semiconductor device capable of obtaining stable characteristics and a method for manufacturing the semiconductor device.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, electrodes, members, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing semiconductor devices practicable by an appropriate design modification by one skilled in the art based on the semiconductor devices, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode to the second electrode being along a first direction, the second electrode including a first electrode region and a second electrode region;
a third electrode, a position of the third electrode in the first direction is between a position of the first electrode in the first direction and a position of the second electrode in the first direction;
a first semiconductor region including $Al_{x1}Ga_{1-x1}N$ ($0 \le x1 < 1$), the first semiconductor region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, the fourth partial region being between the first partial region and the third partial region in the first direction, the fifth partial region being between the third partial region and the second partial region in the first direction;
a second semiconductor region including $Al_{x2}Ga_{1-x2}N$ ($x1 < x2 \le 1$), the second semiconductor region including a first semiconductor portion, a second semiconductor portion, and a third semiconductor portion, a direction from the fourth partial region to the first semiconductor portion being along the second direction, a direction from the fifth partial region to the second semiconductor portion being along the second direction, at least a part of the third semiconductor portion being between the first semiconductor region and the second electrode region in the second direction, the second semiconductor portion being between the first semiconductor portion and the third semiconductor region portion in the first direction, the third semiconductor portion including silicon and the second semiconductor region not including silicon, or a concentration of silicon in the second semiconductor portion being lower than a concentration of silicon in the third semiconductor portion; and a first member including silicon and at least one selected from the group consisting of nitrogen and oxygen, the first member including a first region and a second region, the second semiconductor portion being between the fifth partial region and the first region in the second direction, at least a part of the second region being between the third semiconductor portion and the second electrode region in the second direction, a concentration of silicon in the second region being higher than a concentration of silicon in the first region.

2. The device according to claim 1, wherein a part of the third semiconductor portion is located between the second partial region and the first electrode region in the second direction.

3. The device according to claim 1, wherein
a part of the second partial region includes silicon, and the fifth partial region does not include silicon, or
a concentration of silicon in the part of the second partial region is higher than a concentration of silicon in the fifth partial region.

4. The device according to claim 1, wherein the concentration of the silicon in the third semiconductor portion is not less than $1\times10^{17}$ cm$^{-3}$ and not more than $1\times10^{21}$ cm$^{-3}$.

5. The device according to claim 1, wherein the concentration of the silicon in the second region is 1.01 times or more the concentration of the silicon in the first region.

6. The device according to claim 1, wherein at least a part of the third electrode is between the first semiconductor portion and the second semiconductor portion in the first direction.

7. The device according to claim 6, wherein
the first member includes a first portion, a second portion, and a third portion,
the first portion is between the first semiconductor portion and at least the part of the third electrode in the first direction,
the second portion is between the at least part of the third electrode and the second semiconductor portion in the first direction, and
the third portion is between the third partial region and at least a portion of the third electrode in the second direction.

8. The device according to claim 7, further comprising a first compound member including $Al_{y1}Ga_{1-y1}N(0<y1\leq1)$,
the first compound member including a first compound region, a second compound region, and a third compound region,
the first compound region being between the first semiconductor portion and the first portion in the first direction,
the second compound region being between the second portion and the second semiconductor portion in the first direction, and
the third compound region being between the third partial region and the third portion in the second direction.

9. The device according to claim 8, wherein
the first compound member includes a fourth compound region and a fifth compound region,
the fourth compound region is between the second semiconductor portion and the first region in the second direction,
the fifth compound region is between the third semiconductor portion and the second region in the second direction,
the fifth compound region includes silicon and the fourth compound region does not include silicon, or a concentration of silicon in the fifth compound region is higher than a concentration of silicon in the fourth compound region.

10. The device according to claim 1, wherein a part of the third electrode is between the fourth partial region and the fifth partial region in the first direction.

11. The device according to claim 1, wherein
a part of the third semiconductor portion is between the second partial region and the first electrode region in the second direction, and
the part of the third semiconductor portion is in contact with the first electrode region.

12. The device according to claim 1, wherein a part of the second region is between the second partial region and the first electrode region in the second direction.

13. The device according to claim 1, wherein
a distance between the first electrode and the third electrode being shorter than a distance between the second electrode and the third electrode,
the first electrode being electrically connected to the first semiconductor portion, and
the second electrode being electrically connected to the third semiconductor portion.

14. A semiconductor device, comprising:
a first electrode;
a second electrode, a direction from the first electrode to the second electrode being along a first direction, the second electrode including a first electrode region and a second electrode region;
a third electrode, a position of the third electrode in the first direction is between a position of the first electrode in the first direction and a position of the second electrode in the first direction;
a first semiconductor region including $Al_{x1}Ga_{1-x1}N$ ($0\leq x1<1$), the first semiconductor region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, the fourth partial region being between the first partial region and the third partial region in the first direction, the fifth partial region being between the third partial region and the second partial region in the first direction; a second semiconductor region including $Al_{x1}Ga_{1-x2}N(x1<x2\leq1)$, the second semiconductor region including a first semiconductor portion, a second semiconductor portion, and a third semiconductor portion, a direction from the fourth partial region to the first semiconductor portion being along the second direction, a direction from the fifth partial region to the second semiconductor portion being along the second direction, at least a part of the third semiconductor portion being between the first semiconductor region and the second electrode region in the second direction, the second semiconductor portion being between the first semiconductor portion and the third semiconductor portion in the first direction, the third semiconductor portion including silicon and the second semiconductor region not including silicon, or a concentration of silicon in the second semiconductor portion being lower than a concentration of silicon in the third semiconductor portion;

a first member including silicon and at least one selected from the group consisting of nitrogen and oxygen, the first member including a first region and a second region, the second semiconductor portion being between the fifth partial region and the first region in the second direction, at least a part of the second region being between the third semiconductor portion and the second electrode region in the second direction, a concentration of silicon in the second region being higher than a concentration of silicon in the first region; and a second member including silicon and at least one selected from the group consisting of nitrogen and oxygen, the second member including a third region and a fourth region, at least a part of the fourth region being between the third region and the first electrode region in the first direction, the first region being located between the fifth partial region and the third region in the second direction, at least a part of the fourth region being between the second region and the second electrode region in the second direction, and a concentration of silicon in the fourth region being higher than a concentration of silicon in the third region.

15. The device according to claim 14, wherein the concentration of the silicon in the fourth region is 1.01 times or more the concentration of the silicon in the third region.

16. A semiconductor device, comprising:
a first electrode;
a second electrode, a direction from the first electrode to the second electrode being along a first direction, the second electrode including a first electrode region and a second electrode region;
a third electrode, a position of the third electrode in the first direction is between a position of the first electrode in the first direction and a position of the second electrode in the first direction;
a first semiconductor region including $Al_{x1}Ga_{1-x1}N$ ($0 \leq x1 < 1$), the first semiconductor region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the third electrode being along the second direction, the fourth partial region being between the first partial region and the third partial region in the first direction, the fifth partial region being between the third partial region and the second partial region in the first direction;

a second semiconductor region including $Al_{x2}Ga_{1-x2}N$ ($x1 < x2 \leq 1$), the second semiconductor region including a first semiconductor portion, a second semiconductor portion, and a third semiconductor portion, a direction from the fourth partial region to the first semiconductor portion being along the second direction, a direction from the fifth partial region to the second semiconductor portion being along the second direction, at least a part of the third semiconductor portion being between the first semiconductor region and the second electrode region in the second direction, the second semiconductor portion being between the first semiconductor portion and the third semiconductor portion in the first direction, the third semiconductor portion including silicon and the second semiconductor region not including silicon, or a concentration of silicon in the second semiconductor portion being lower than a concentration of silicon in the third semiconductor portion;

a first member including silicon and at least one selected from the group consisting of nitrogen and oxygen, the first member including a first region and a second region, the second semiconductor portion being between the fifth partial region and the first region in the second direction, at least a part of the second region being between the third semiconductor portion and the second electrode region in the second direction, a concentration of silicon in the second region being higher than a concentration of silicon in the first region; and a third member including silicon and at least one selected from the group consisting of nitrogen and oxygen, the third region being between the first region and a part of the third member in the second direction, the fourth region being between the second region and a part of the third member in the second direction, and the second electrode region being between the fourth region and a part of the third member in the second direction.

17. The device according to claim 16, further comprising a second conductive member electrically connected with the second electrode,
a part of the third member being provided between the second electrode region and the second conductive member in the second direction.

18. The device according to claim 16, further comprising:
a first conductive member electrically connected with the first electrode; and
a third conductive member electrically connected with the third electrode,
a part of the third member being located between the first semiconductor portion and the first conductive member, and between the second semiconductor portion and the third conductive member in the second direction.

* * * * *